United States Patent
Koizumi et al.

(10) Patent No.: US 7,651,655 B2
(45) Date of Patent: Jan. 26, 2010

(54) PRODUCTION METHODS OF DIELECTRIC LAYER AND DIELECTRIC ELEMENT, DIELECTRIC ELEMENT, AND PIEZOELECTRIC TRANSFORMER

(75) Inventors: Takaaki Koizumi, Nagoya (JP); Hirofumi Yamaguchi, Komaki (JP); Iwao Ohwada, Nagoya (JP); Tsutomu Nanataki, Toyoake (JP)

(73) Assignee: NGK Insulators, Ltd., Nagoya-Shi (JP)

( * ) Notice: Subject to any disclaimer, the term of this patent is extended or adjusted under 35 U.S.C. 154(b) by 538 days.

(21) Appl. No.: 11/301,711

(22) Filed: Dec. 13, 2005

(65) Prior Publication Data

US 2006/0138907 A1    Jun. 29, 2006

(30) Foreign Application Priority Data

Dec. 24, 2004    (JP)    ............................ 2004-372631

(51) Int. Cl.
*H01L 41/00* (2006.01)
*H01L 41/22* (2006.01)
(52) U.S. Cl. .................. 264/614; 310/357; 310/363
(58) Field of Classification Search ................ 264/614
See application file for complete search history.

(56) References Cited

U.S. PATENT DOCUMENTS

2004/0120881 A1*  6/2004  Takao et al. .............. 423/594.7
2006/0145401 A1*  7/2006  Mihara et al. ............... 264/618

FOREIGN PATENT DOCUMENTS

JP    8-191160    7/1996
JP    9-116205    5/1997

* cited by examiner

*Primary Examiner*—Steven P Griffin
*Assistant Examiner*—Cynthia Szewczyk
(74) *Attorney, Agent, or Firm*—Burr & Borwn

(57) ABSTRACT

A method of producing a dielectric layer made of a polycrystalline dielectric material having anisotropy in the coefficient of thermal expansion is provided, including the steps of providing a raw material powder, and heat treating the raw material powder at least to a temperature sufficient to cause a phase change from a first crystal orientation at room temperature to a different crystal orientation to provide an aggregate of oriented raw material particles having the same chemical composition as the raw material powder but having the different crystal orientation. The method also includes a step of forming a compact from the aggregate of oriented raw material particles, including a step of applying a shearing force to the aggregate and firing the compact to form the dielectric layer.

9 Claims, 4 Drawing Sheets

PRODUCTION METHODS OF DIELECTRIC LAYER AND DIELECTRIC ELEMENT, DIELECTRIC ELEMENT, AND PIEZOELECTRIC TRANSFORMER

BACKGROUND OF THE INVENTION

1. Field of the Invention

The present invention relates to a dielectric element including a dielectric layer and electrodes, such as a piezoelectric transformer, a SAW (Surface Acoustic Wave) element, an electron emitter or the like, and production methods of the dielectric layer and the dielectric element.

2. Description of the Related Art

With regard to such dielectric elements, various materials have been studied as materials composing a dielectric layer with the aim of the improvement of the performance, the downsizing of the element, and the reduction of the cost.

For example, a piezoelectric transformer is widely known as such a dielectric element. The piezoelectric transformer includes a dielectric layer, an input electrode, an output electrode, and a ground electrode. The input electrode and the ground electrode are formed in parallel with the surface of the dielectric layer and disposed so that the electrodes face each other at a prescribed interval. A dielectric material that composes the dielectric layer intervenes between the input electrode and the ground electrode, and the dielectric layer is prepared so as to mechanically vibrate (so that a stress is generated in the dielectric layer) by inverse piezoelectric effect caused by applying pulse-shaped input voltage between the input electrode and the ground electrode. The output electrode is formed for example at the end face of the dielectric layer and prepared so as to output the voltage generated between the output electrode and the ground electrode by piezoelectric effect caused by the mechanical vibration or the stress.

Such piezoelectric transformers can be used in various kinds of applications such as: a hot-cathode tube inverter used for a fluorescent lamp or the like; a backlight cold-cathode tube inverter for a liquid crystal display used for a large-screen liquid crystal television, a notebook personal computer, a portable remote terminal or the like; an AC adapter and a DC-DC converter used for various kinds of electronic equipment including various kinds of high-voltage transformer assembly, a negative ion generator, an air cleaner and the like; and others.

As a dielectric layer composing the piezoelectric transformer, PZT ceramics (refer to JP-A No. 116205/1997) and lithium niobate monocrystal (refer to JP-A No. 191160/1996) have heretofore been generally known. The piezoelectric transformer, which uses the PZT ceramics, disclosed in JP-A No. 116205/1997 contains Pb which is a material hazardous to environment and hence the control of Pb has been necessary in the production processes. In this light, a piezoelectric transformer having a lead-free dielectric layer as described in JP-A No. 191160/1996 has actively been studied in recent years.

However, in the case of the piezoelectric transformer, which uses the PZT ceramics, described in JP-A No. 116205/1997, the mechanical quality factor Qm of the PZT ceramics is small (3,000 to 4,000). Therefore, the change of properties and the loss of electric power caused by the heat generation of the dielectric layer increase and hence the piezoelectric transformer has not been used for a high electric power application of 5 W or more and it has also been difficult to increase the step up ratio.

Meanwhile, there have been various problems also in the case of a piezoelectric transformer, which uses lithium niobate monocrystal in order to reduce the environmental load and realize a high step up ratio and high efficiency by a large Qm (10,000 or more), disclosed in JP-A No. 191160/1996.

For example, the lithium niobate monocrystal is more expensive than polycrystalline materials such as PZT ceramics and the like. Further, if it is attempted to form a thinner dielectric layer in order to downsize an element or increase the step up ratio by forming a multilayer, microcracks have been generated, thus the yield has deteriorated, and the cost has further increased when wafers are cut out from a monocrystal ingot.

Furthermore, when the piezoelectric transformer is used for high electric power applications, there has been the possibility that the stress generated in the dielectric layer due to mechanical vibration concentrates at the nodes of the mechanical vibration and the dielectric layer breaks at the nodes of the vibration. Therefore, it has been necessary to increase the thickness of the nodes of the vibration where the stress concentrates, and expand the width of the substrate in order to make the cracks of the dielectric layer hardly generated even in the high electric power applications. Consequently, the downsizing and profile reduction of the piezoelectric transformer have been difficult.

In addition, when the thickness of the dielectric layer is increased in order to make the aforementioned cracks hard to be generated, the operating impedance increases. As a consequence, in this case, it has been necessary to boost the piezoelectric transformer by introducing a wound transformer or the like to the front of the piezoelectric transformer and hence the downsizing and profile reduction of the piezoelectric transformer have further been difficult. Further, when the width of the substrate is expanded, spurious vibration has occurred and the efficiency has lowered.

SUMMARY OF THE INVENTION

The present invention has been established in view of the aforementioned problems and the object thereof is to provide a dielectric layer capable of realizing higher performance, downsizing, and cost reduction of a dielectric element, a dielectric element such as a piezoelectric transformer having the dielectric layer, and production methods thereof.

The present invention is intended to be applied to a method of producing a dielectric layer including a polycrystalline dielectric material having anisotropy in the coefficient of thermal expansion. Further, the present invention is intended to be applied to a method of producing a dielectric element including a dielectric layer including a polycrystalline dielectric material having anisotropy in the coefficient of thermal expansion and electrodes which are formed in parallel with the surface of the dielectric layer and disposed on the surface and/or in the interior of the dielectric layer.

The method of producing a dielectric layer according to the present invention includes a compact forming process of producing a compact including the aggregate of oriented raw material particles which are raw material particles having a crystal lattice oriented in a prescribed direction and a shape the longitudinal direction of which forms a prescribed angle with the prescribed direction and a firing process of firing the compact. Further, a method of producing a dielectric element according to the present invention includes a compact forming process of producing a laminar compact from the aggregate of the oriented raw material particles, and a firing process of producing the dielectric layer by firing the compact.

With the aim of attaining the above objects, the present invention is characterized in that the compact forming process includes a process of applying shearing force to the aggregate.

Examples of the dielectric materials include lithium niobate ($LiNbO_3$); lithium tantalate ($LiTaO_3$); the solid solution of those ($LiNb_{1-x}Ta_xO_3$); a substance produced by substituting K or Na for Li in each of the above materials (the general expression is $ABO_3$, wherein A represents at least one element of K, Na and Li and B represents Nb and/or Ta); lithium tetraborate ($Li_2B_4O_7$); and others.

Examples of materials composing the raw material particles include the raw material of a dielectric material (for example, when the dielectric material is lithium niobate, niobium pentoxide ($Nb_2O_5$)); and the dielectric material itself (in the above example, lithium niobate).

Examples of the process, which is included in the compact forming process, of applying shearing force to the aggregate, include tape forming; extrusion forming; screen printing; and others.

In the present invention, examples of the raw material particles (for example, $Nb_2O_5$ particles and tantalum pentoxide ($Ta_2O_5$) particles) of the dielectric layer include oriented raw material particles: having a crystal lattice oriented in a prescribed direction (for example, in the direction of the c axis); and being formed into a shape (for example, the shape of a bar) the longitudinal direction of which forms a prescribed angle (for example, zero degree) with the prescribed direction. Then in the compact forming process, the aggregate of the oriented raw material particles is formed so that shearing force is applied to the aggregate and thereby the compact is produced. Since the compact is formed while applying shearing force to the aggregate in the compact forming process as stated above, the oriented raw material particles are aligned so that the longitudinal direction thereof is identical to the direction of the shearing force in the compact. Then by firing a compact of such a configuration, a dielectric layer having a high degree of crystal orientation is produced.

By the present invention stated above, it is possible to form a polycrystalline dielectric layer having a high degree of crystal orientation and a desired dimension only by forming the aggregate into the desired dimension (thickness in particular) and firing the compact in the compact forming process without the application of mechanical working such as cutout from an ingot. As a consequence, even in the case of forming a thin dielectric layer from a dielectric material having anisotropy in the coefficient of thermal expansion, the generation of cracks due to the anisotropy of the contraction caused by the anisotropy of the coefficient of thermal expansion during the cooling after the firing or the generation of microcracks caused by mechanical working is inhibited.

Another feature of the present invention is that the present invention further includes a heat treating process of producing the aforementioned oriented raw material particles by heating raw material powder of a dielectric material to a temperature not lower than the temperature at which phase transformation to a crystal structure different from a crystal structure formed at the room temperature occurs. Thereby, the particles composing the raw material powder of the dielectric material are agglutinated and bonded to each other while the phase transformation occurs, and resultantly the oriented raw material particles used for forming a polycrystalline dielectric layer having a high degree of crystal orientation are produced through very simple processes.

Another feature of the present invention is that powder of $Nb_2O_5$ and/or $Ta_2O_5$ is used as the raw material powder, and in the heat treating process, the oriented raw material particles containing $Nb_2O_5$ and/or $Ta_2O_5$ and having a crystal lattice oriented in the direction of the c axis and a shape the longitudinal direction of which is identical to the c axis direction are formed. The compact forming process includes a process of mixing the oriented raw material particles with carbonate or oxide of at least one element of K, Na and Li and, in the firing process, the dielectric material including a substance expressed by the general expression $ABO_3$ (A represents at least one element of K, Na and Li and B represents Nb and/or Ta) is produced by subjecting the oriented raw material particles and the carbonate or oxide to solid phase reaction and a polycrystalline dielectric material is produced by growing the crystal grains of the dielectric material.

In the present invention, the powder of $Nb_2O_5$ and/or $Ta_2O_5$ which is the raw material powder of the dielectric material expressed by the above general expression is heated to a temperature of 1,000° C. to 1,300° C. Thereby, $Nb_2O_5$ and/or $Ta_2O_5$ which are/is an orthorhombic crystal at the room temperature are/is phase-transformed into a monoclinic crystal and simultaneously adjacent particles in the raw material powder are agglutinated and bonded to each other and hence the oriented raw material particles of $Nb_2O_5$ and/or $Ta_2O_5$ having a lengthy shape (bar shape, columnar shape or the like) the longitudinal direction of which is identical to the c axis direction are produced.

Next, in the compact forming process, the compact is produced by mixing the aforementioned oriented raw material particles with carbonate or oxide of at least one element of K, Na and Li and thereafter forming the mixture so that shearing force is applied to the mixture. Here, as stated above, the oriented raw material particles are in the state where the crystal lattice of $Nb_2O_5$ and/or $Ta_2O_5$ is oriented in the c axis direction and formed into a shape the longitudinal direction of which is identical to the c axis direction. Hence, the compact is in the state where the oriented raw material particles including $Nb_2O_5$ and/or $Ta_2O_5$ are dispersed in the carbonate or the like so that the longitudinal direction thereof is identical to the direction of the shearing force.

Successively, in the firing process, when the produced compact is heated to a prescribed firing temperature, $Nb_2O_5$ and/or $Ta_2O_5$ composing the oriented raw material particles and the carbonate or oxide are subjected to solid phase reaction, thereby the dielectric material expressed by the above general expression is obtained, and the crystal grains of the dielectric material grow under the heating. Here, since the compact is in the state as mentioned above, the crystal grains is formed into the shape the longitudinal direction of which is identical to the c axis direction. Then, in the obtained dielectric layer, the crystal grains are aligned in the longitudinal direction thereof and thus oriented in the c axis direction.

By the present invention stated above, it is possible to produce a dielectric layer of a desired dimension at a high yield by using the dielectric material which is expressed by the aforementioned general expression and has such very high performance as a large Qm.

Another feature of the present invention is that the present invention includes a classifying process of applying classifying treatment to the raw material powder in advance of the heat treating process.

That is, in the present invention, the raw material powder having the same grain diameter is prepared in the classifying process and, by heat-treating the raw material powder, a compact and a dielectric layer of a higher degree of orientation are formed.

Another feature of the present invention is that the compact forming process includes: a slurry forming process of forming slurry by mixing a binder with powder including the oriented raw material particles; and a shear forming process of forming the slurry while applying shearing force to the slurry, and thus producing the compact. Thereby, it is possible to form a compact and a dielectric layer having a high degree of orientation through very simple processes.

Another feature of the production method of a dielectric element according to the present invention is that the production method includes a film forming process of forming a film or films containing an electric conductive material or a precursor thereof on top and/or bottom surface(s) of the compact and a laminating process of laminating a plurality of the compacts so that the longitudinal directions of the particles are aligned in the same direction in the plural compacts after subjected to the film forming process; and the firing process fires and integrates the plural layered compacts laminated while interposing the film(s).

By the present invention, it is possible to produce a multilayered dielectric element having higher performance (in particular, a multilayered dielectric element of lithium niobate, lithium tantalate or the like that has not heretofore been realized with a conventional monocrystal) at a higher yield.

A dielectric element according to the present invention is characterized in that the dielectric element has a first electrode and a second electrode formed in parallel with a surface of a dielectric layer and the dielectric layer includes a polycrystalline dielectric material having a difference in the coefficient of thermal expansion between the a axis direction and the c axis direction of the crystal lattice.

Further, a piezoelectric transformer according to the present invention has a dielectric layer, a first electrode and a second electrode aligned in the direction of the thickness of the dielectric layer and disposed in parallel with each other and a third electrode to output voltage generated between the third electrode and the second electrode due to a piezoelectric effect caused by stress generated in the dielectric layer when input voltage is applied between the first electrode and the second electrode. Then, the feature of the piezoelectric transformer is that the dielectric layer includes a polycrystalline dielectric material having a difference in the coefficient of thermal efficiency between the a axis direction and the c axis direction of the crystal lattice.

In the piezoelectric transformer, when input voltage is applied between the first electrode and the second electrode, the stress is generated in the dielectric layer due to the inverse piezoelectric effect and output voltage is generated between the second electrode and the third electrode due to the piezoelectric effect caused by the stress.

By the present invention of the above configuration, it is possible to produce through simple processes a dielectric layer including a dielectric material that has excellent properties such as a high Qm and others and having a thin thickness that has not heretofore been realized with a monocrystal material. As a consequence, the profile reduction and multi-layering of a dielectric element such as a piezoelectric transformer or the like with a dielectric layer including the dielectric material can be realized at a low cost.

Here, it is preferable that crystal grains composing the polycrystalline material are formed into a shape the longitudinal direction of which is identical to the direction of the c axis, that the crystal grains are aligned in the longitudinal direction in the dielectric layer and that thereby the dielectric layer is oriented in the c axis direction.

By the present invention of the above configuration, cracks caused by the anisotropy of the coefficient of thermal expansion (anisotropy of contraction) are inhibited from being generated in the dielectric layer at the time of forming the dielectric layer (during the cooling after incineration). As a result, the deterioration of conductivity and mechanical strength caused by the cracks is prevented. As a consequence, it is possible to realize a higher degree of freedom in the design of a dielectric layer and a dielectric element such as a piezoelectric transformer or the like which uses the dielectric layer. Further, it is possible to produce a piezoelectric transformer usable for a wide range of applications including high electric power applications at a lower cost.

Further, it is possible to produce at a higher yield a dielectric element such as a so-called multilayered piezoelectric transformer wherein: the first and second electrodes are disposed so as to be laminated in the direction of the thickness of the dielectric layer; and the first and/or second electrodes are disposed in plurality.

Here, as the dielectric material, a substance expressed by the general expression $ABO_3$ (A represents at least one element of K, Na and Li and B represents Nb and/or Ta) can preferably be used.

By the present invention, it becomes possible to realize the downsizing, multi-layering, and higher performance of a dielectric element such as a piezoelectric transformer that uses a dielectric layer at a high yield (at a low cost) through simple processes.

DETAILED DESCRIPTION OF THE INVENTION

Figure 1:
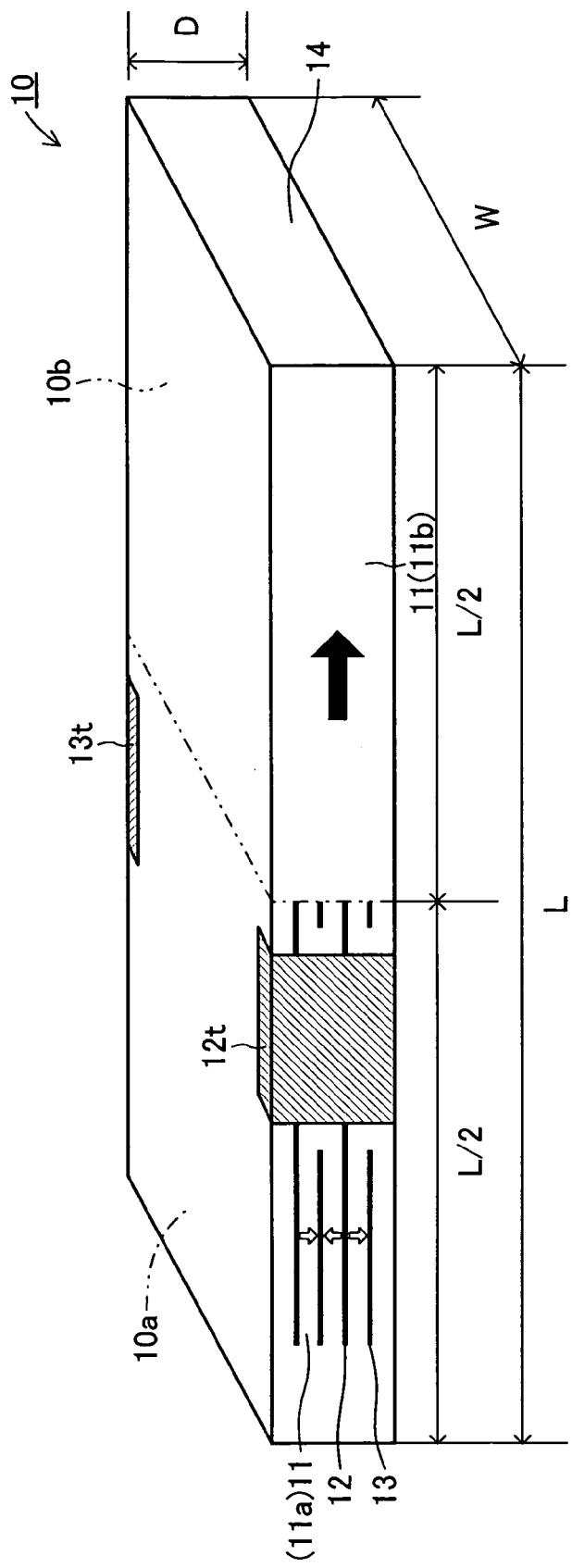
FIG. 1 is an outside drawing (perspective view) showing the general configuration of a piezoelectric transformer according to the first embodiment of the present invention.

Preferred embodiments according to the present invention are hereunder explained referring to the drawings.

Configuration of Piezoelectric Transformer According to the First Embodiment

Figure 2:
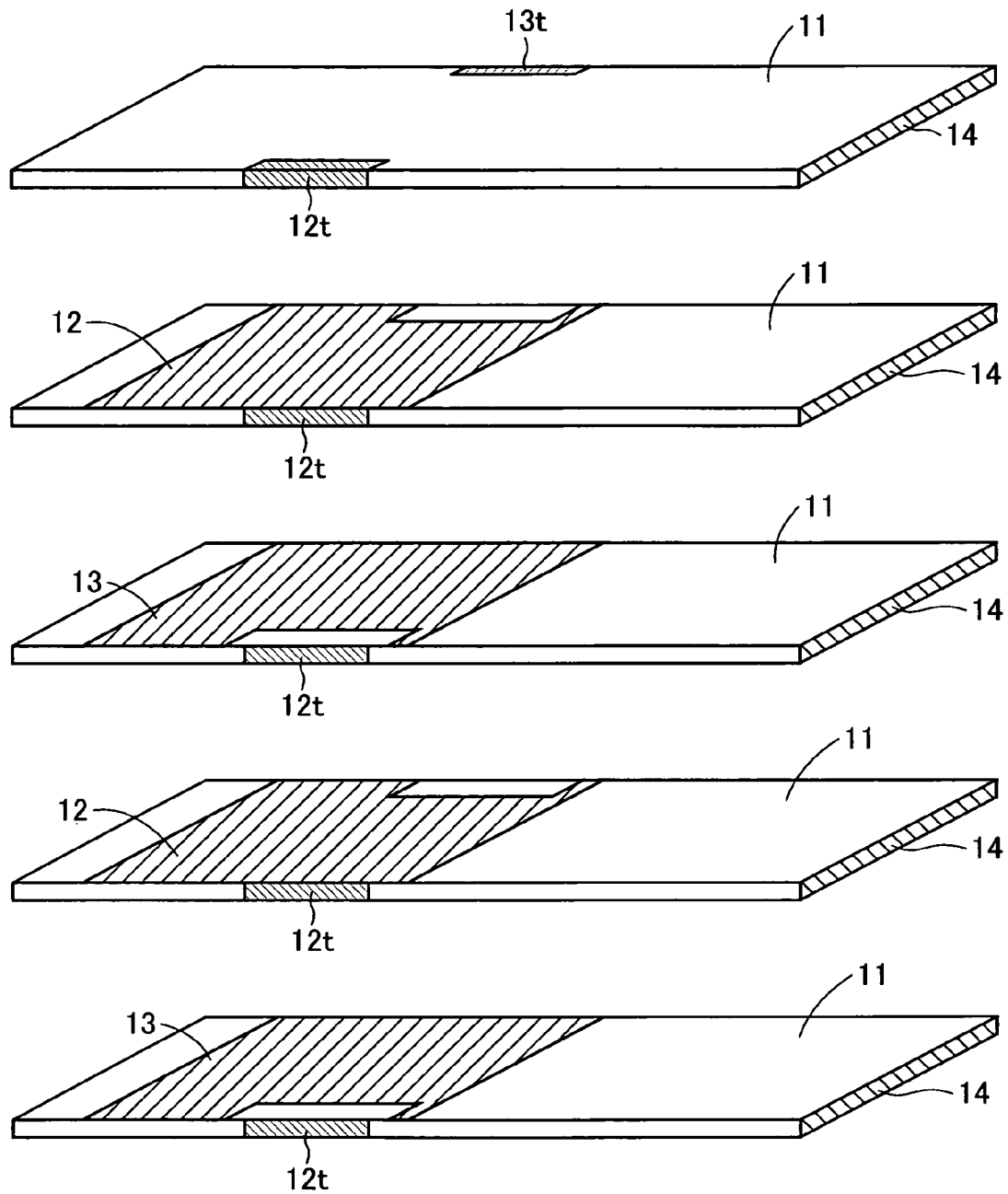
FIG. 2 is an exploded perspective view of the piezoelectric transformer shown in FIG. 1.

FIG. 1 is a perspective view of a piezoelectric transformer 10 according to the present embodiment, and FIG. 2 is an exploded perspective view of the piezoelectric transformer 10 according to the present embodiment.

The piezoelectric transformer 10 has the dimension of L in longitudinal length, W in width, and D in thickness. The piezoelectric transformer 10 is configured so that the function is divided into two parts of a primary side 10a and a secondary side 10b interposing the center in the longitudinal direction.

More specifically, at the primary side 10a, plural input electrodes 12 and plural ground electrodes 13 interpose a dielectric layer 11 (primary side dielectric layers 11a) and are disposed in the manner of being laminated alternately. The input electrodes 12 and ground electrodes 13 are formed into a tabular shape parallel with the surface (top surface) of the dielectric layer 11. The plural input electrodes 12 are electrically connected to each other with a terminal 12t at an end of the dielectric layer 11 of the primary side 10a. The plural ground electrodes 13 are electrically connected to each other with a terminal 13t likewise.

At the secondary side 10b, an output electrode 14 is formed at the end face, of the dielectric layer 11 (secondary side dielectric layer 11b), located at the end of the piezoelectric transformer 10 in the longitudinal direction thereof.

The region interposed between the input electrode 12 and the ground electrode 13 in each of the primary side dielectric layers 10a is polarized in the thickness direction of the dielectric layer 11 as shown by each of the hollow arrows in the figure. Then, the directions of the polarization are set so that the directions of the polarization in the plural regions adjacent to each other are reversed by 180 degrees in the vertical direction.

Meanwhile, in the secondary side dielectric layer 10b, the secondary side dielectric layer 10b is polarized in the longitudinal direction of the piezoelectric transformer 10 as shown by the solid arrow in the figure.

In the piezoelectric transformer 10 having such a configuration, it is designed so that the primary side dielectric layers 11a mechanically vibrate due to the inverse piezoelectric effect caused by the input of pulse-shaped input voltage between the input electrodes 12 and the ground electrodes 13, and pulse-shaped output voltage is generated due to the piezoelectric effect between the ground electrodes 13 and the output electrode 14 by the propagation of the mechanical vibration into the secondary side dielectric layer 11b.

Material of Each Component of the Piezoelectric Transformer

As the dielectric layer 11, various kinds of ever known piezoelectric ceramics can be used. Here, for the dielectric layer 11 according to the present embodiment, a lead-free material having a large Qm can preferably be used. The examples are: lithium niobate ($LiNbO_3$); lithium tantalate ($LiTaO_3$); the solid solution of those ($LiNb_{1-x}Ta_xO_3$); a substance produced by substituting K or Na for Li in each of the above materials (a general expression is $ABO_3$, wherein A represents at least one element of K, Na and Li and B represents Nb and/or Ta); lithium tetraborate ($Li_2B_4O_7$); CaNdAlO$_4$; and others.

Lithium niobate has a trigonal ilmenite structure, the lattice constants thereof are a=5.15 and c=13.68 in angstrom, and the coefficients of linear thermal expansion thereof (at 200° C.) are $\alpha_a=3\times10^{-6}/°$ C. and $\alpha_c=8\times10^{-6}/°$ C. Lithium tantalate has a trigonal ilmenite structure, the lattice constants thereof are a=5.15 and c=13.78 in angstrom, and the coefficients of linear thermal expansion thereof are $\alpha_a=1.6\times10^{-6}/°$ C. and $\alpha_c=4.1\times10^{-6}/°$ C. In a dielectric material having a structure of $ANb_{1-x}Ta_xO_3$, whereas the dielectric material forms an ilmenite structure as stated above because the size of the Li ions is small when A is Li, it can form a perovskite structure by replacing all or a part of Li with Na or the like of a larger size.

Lithium tetraborate is tetragonal, the lattice constants thereof are a=9.48 and c=10.28 in angstrom, and the coefficients of linear thermal expansion thereof are $\alpha_a=4\times10^{-4}/°$ C. and $\alpha_c=13\times10^{-4}/°$ C. CaNdAlO$_4$ has a $K_2NiF_4$ type perovskite structure, the lattice constants thereof are a=3.68 and c=12.15 in angstrom, and the coefficients of linear thermal expansion thereof are $\alpha_a=8.7\times10^{-6}/°$ C. and $\alpha_c=1.6\times10^{-5}/°$ C.

As stated above, in those materials, there is a large difference between the lattice constants a and c, and the coefficient of linear thermal expansion $\alpha_c$ in the c axis direction is considerably larger than the coefficient of linear thermal expansion $\alpha_a$ in the a axis direction. When a polycrystalline dielectric layer 11 is formed with such a material, cracks may be generated due to the difference of contraction caused by the aforementioned difference in the coefficient of linear thermal expansion during the cooling after the incineration of the dielectric layer 11. Then, in order to avoid generating such cracks, in the dielectric layer 11 according to the present embodiment, the crystal grains are formed so that the longitudinal direction thereof is oriented to the c axis direction and the dielectric layer 11 is configured so as to have the orientation of the c axis direction as a whole.

As the input electrodes 12, the ground electrodes 13, and the output electrode 14, a metallic film, metallic particles, a nonmetallic conductive film (a carbon film, a nonmetallic conductive oxide film or the like), or nonmetallic conductive particles (carbon particles, nonmetallic conductive oxide particles or the like) may be used. Those input electrodes 12 and others are formed so as to have prescribed thicknesses by coating or vapor deposition. As the materials of the metallic film and metallic particles, platinum, gold, silver, iridium, palladium, rhodium, molybdenum, tungsten, and the alloys of those metals are preferably used. Further, as the materials of the nonmetallic conductive film and nonmetallic conductive particles, graphite, ITO (indium-tin oxide), LSCO (lanthanum-strontium-copper oxide), and others are preferably used.

Concrete Example of Production Method of Piezoelectric Transformer

A concrete example of the production method of the aforementioned piezoelectric transformer 10 is explained hereunder. In the concrete example, the explanations are given on the premise that lithium niobate is used as the material of the dielectric layer 11 and platinum electrodes produced by coating and heat-treating platinum resinate are used as the input electrodes 12 and other electrodes.

Firstly, commercially available powder of niobium pentoxide ($Nb_2O_5$) is classified, fine powder is removed, and thus powder of niobium pentoxide having a prescribed grain size distribution is produced (classifying process).

Secondly, the niobium pentoxide powder after classified is subjected to heat treatment at 1,000° C. to 1,300° C. (preferably 1,200° C.) (heat-treating process). Thereby, the niobium pentoxide changes from a orthorhombic crystal to a monoclinic crystal by phase transformation, at the same time the niobium pentoxide powder is agglutinated and bonded, and thereby bar-shaped or columnar c-axis-oriented niobium pentoxide particles the longitudinal direction of which is identical to the c axis direction are formed.

Successively, the produced c-axis-oriented niobium pentoxide particles are mixed with lithium carbonate ($Li_2CO_3$) and a binder, and thus slurry is produced (slurry forming process). Next, the slurry is formed into a tape by the doctor blade method and thus a sheet-shaped compact is produced (shear forming process). Thereby, bar-shaped or columnar c-axis-oriented niobium pentoxide particles are aligned in the direction of forming the tape (the direction of the traveling of the formed tape) and in the meantime a compact filled with lithium carbonate is produced. Next, the produced sheet-shaped compact is coated with platinum resinate paste by screen printing and thus paste films of the patterns corresponding to the shapes of the input electrodes 12 and the ground electrodes 13 (refer to FIG. 2) are formed (film forming process). Next, the sheet-shaped compacts on which the paste films are formed are laminated and fired (firing process). Thereby a compact of plural layers is integrated and thus a dielectric layer 11 is formed.

Successively, the side faces and end face of the dielectric layer 11 produced by the incineration are coated with platinum resinate paste by screen printing, the paste films of the patterns corresponding to the terminals 12t, the terminals 13t, and the output terminal 14 are formed and thereafter heattreated, and thereby the terminals 12t, the terminals 13t, and the output terminal 14 are formed (terminal forming process). Next, the primary side dielectric layers 11a are polarized by applying voltage between the input electrodes 12 and the ground electrodes 13. Thereafter, voltage is applied between: the input electrodes 12 and the ground electrodes 13 as the negative side; and the output electrode 14 as the positive side, and thus the secondary side dielectric layer 11b is polarized. By so doing, a Rosen-type piezoelectric transformer 10 of a laminated structure is produced.

In the dielectric layer 11 composing the piezoelectric transformer 10 according to the present embodiment, the crystal grains are formed into a shape the longitudinal direction of which is identical to the c axis direction and aligned so that the longitudinal directions of the crystal grains are in the same direction. That is, the dielectric layer 11 is formed as a polycrystalline material oriented in the c axis direction. As a consequence, even when a material such as lithium niobate having anisotropy in the coefficient of thermal expansion is used as the dielectric material composing the dielectric layer 11, cracks are prevented from being generated in the dielectric layer 11 during the cooling in the incineration process and the terminal forming process.

Second Embodiment

Figure 3:
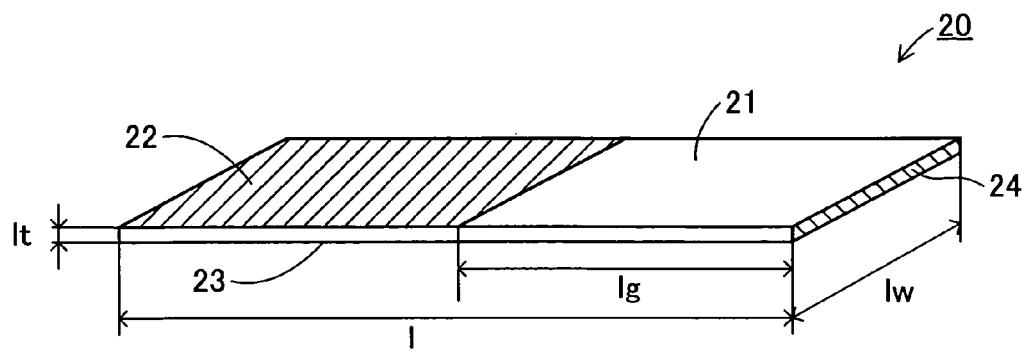
FIG. 3 is an outside drawing (perspective view) showing the general configuration of a piezoelectric transformer according to the second embodiment of the present invention.

FIG. 3 is an outside drawing showing the general configuration of a piezoelectric transformer 20 which is a secondary Rosen-type piezoelectric transformer of the simplest configuration. The piezoelectric transformer 20 is of a single-layered type unlike with the piezoelectric transformer 10 of the multilayered type shown in FIGS. 1 and 2. The piezoelectric transformer 20 includes a dielectric layer 21, an input electrode 22, a ground electrode 23, and an output electrode 24.

The piezoelectric transformer 20 shown in FIG. 3 may be produced also by a method similar to the above method.

Effect of Embodiment

The effect of the production method according to the present embodiment is hereunder explained in detail in reference to the piezoelectric transformer 20 of the simplest configuration shown in FIG. 3.

In the piezoelectric transformer 20 shown in FIG. 3, when the output terminals are disconnected (the load of the output side is ignored), the step up ratio $\gamma_0$ is expressed by the following expression (1).

$$\gamma_0 = 4k_{31}k_{33}Qml_g/\pi^2 l_t \quad (1)$$

[$k_{31}$ and $k_{33}$ are the electromechanical coupling factors of the dielectric material composing the dielectric layer 21, $l_g$ is the length of the power generating section in the dielectric layer 21, and $l_t$ is the thickness of the dielectric layer 21]

Figure 4:
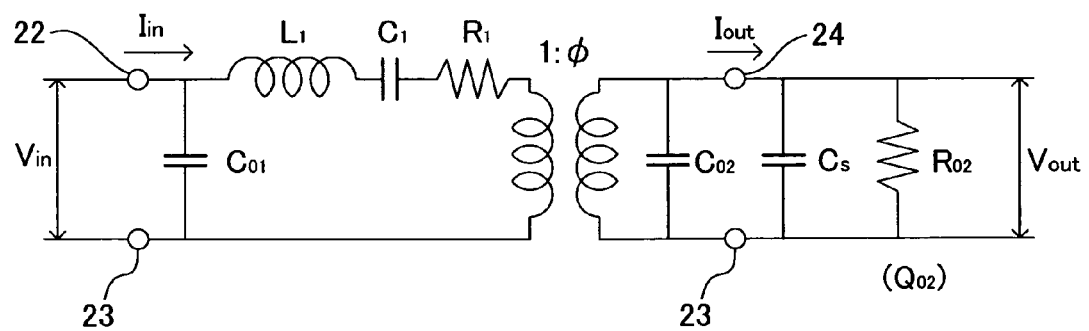
FIG. 4 is a view showing an equivalent circuit when a load circuit is connected to the piezoelectric transformer shown in FIG. 3.

Meanwhile, when a load circuit is connected to the output terminals (namely, between the ground electrode 23 and the output electrode 24 in FIG. 3), it is estimated that the equivalent circuit shown in FIG. 4 is formed. The step up ratio $\gamma$ in this case is expressed by the following expression (2).

$$\gamma = 2\pi \frac{k_{31}}{k_{33}}(1-k_{31}^2)\varepsilon_{33}^T l_\omega R_{02}(1+S)\frac{v_b^D}{2l_g} \times \quad (2)$$

-continued $$\sqrt{\frac{s_{33}^E}{s_{11}^E}\left[1 - \frac{1 - A\{1 + SQ_{02}^2(1+S)\}}{Q_{02}^2(1+S)^2}\right]}$$
$$1 + \frac{Q_{02}}{AQ_m}(1+S)^2\left\{1 + \frac{1}{Q_{02}^2(1+S)^2}\right\}$$

Here, $v_b^D = (1/\rho s_{33}^D)^{1/2}$ and $Q_{02} = \omega C_{02} R_{02}$. [$\rho$ is a density, $\in$ is a conductivity, S is a leak capacity ratio, s is an elastic constant, and $\omega$ is each frequency]

Further, A is expressed by the following expression.

$$A = \frac{8}{\pi^2} \frac{k_{33}^2}{1 + \sqrt{\frac{s_{33}^D}{s_{11}^E}}}$$

In the above expressions, A and Qm are constants intrinsic to the material, and $Q_{02}$ and S are peculiarity indexes of the load circuit.

Figure 5:
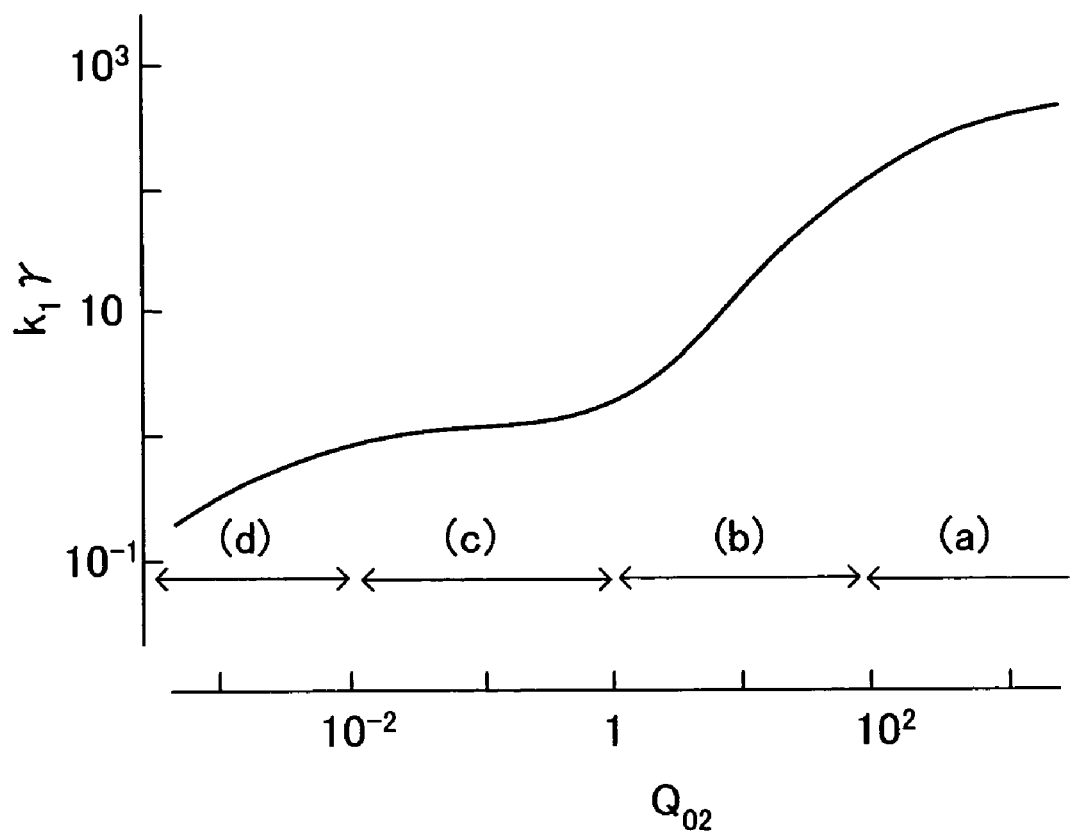
FIG. 5 is a graph showing the relationship between load and a step up ratio in the equivalent circuit shown in FIG. 4.

The relationship between $\gamma$ and $Q_{02}$ in the expression (2) is expressed by the graph shown in FIG. 5 (here, $k_1 = l_t/l_g$ in FIG. 5). As it is obvious from FIG. 5, the feature of the change of the step up ratio $\gamma$ when $Q_{02}$ which is a value related to load varies can be analyzed by classifying the total range of $Q_{02}$ into four regions shown by (a) to (d) in the figure.

Firstly, in the case of the region (a) wherein nearly no load or light load is applied and thus output voltage is scarcely consumed, namely $Q_{02} \to \infty$, the above expression (1) approximates the following expression (3).

$$\gamma \cong \frac{\gamma_0}{1+S} = \frac{4}{\pi^2}k_{31}k_{33}Q_m \frac{l_g}{l_t} \frac{2\sqrt{\frac{s_{33}^E}{s_{11}^E}}}{1+\sqrt{\frac{s_{33}^E}{s_{11}^E}}} \frac{1}{1+S} \quad (3)$$

Further, in the case of the region (b) which is the loaded region mainly on the occasion of the application to an inverter for a large-screen liquid crystal television, namely $Q_{02}/Qm<1$ and $1<Q_{02}<<AQm$, the above expression (1) approximates the following expression (4).

$$\gamma \cong \phi Q_{02}(1+S) \cong 2\pi\frac{k_{31}}{k_{33}}(1-k_{33}^2)\varepsilon_{33}^T\frac{l_\omega}{l_g}\frac{v_b^D}{2}R_{02}(1+S)\sqrt{\frac{s_{33}^D}{s_{11}^E}} \quad (4)$$

Furthermore, in the case of the region (c) of heavier load wherein the output current is more consumed than in the case of the region (b), namely $Q_{02}<1<<AQm$, the above expression (1) approximates the following expression (5).

$$\gamma \cong \phi = \frac{l_g}{l_t}\frac{k_{31}}{k_{33}}\sqrt{\frac{s_{33}^E}{s_{11}^E}} \quad (5)$$

In the case of the region (d) of far heavier load than in the case of the region (c), namely $Q_{02}<<1$, the above expression (1) approximates the following expression (6).

$$\gamma \cong A\phi Q_m Q_{02} = \frac{8}{\pi} \frac{\sqrt{s_{33}^E/s_{11}^E}}{1+\sqrt{s_{33}^D/s_{11}^E}} k_{31}k_{33}(1-k_{33}^2)Q_m \frac{l_w}{l_g} v_b^D R_{02} \quad (6)$$

The influence of various design parameters (the parameters intrinsic to the material of the dielectric layer 21 and the parameters of the shapes of the piezoelectric transformer 20 and the dielectric layer 21 contained in the expressions (3) to (6)) of the piezoelectric transformer 20 on the step up ratio γ in the load regions (a) to (d) (applications) is summarized on the basis of the expressions (3) to (6), and the summarized result is shown in Table 1. In the table, the mark ○ represents that the step up ratio γ increases by the increase of the value of the relevant parameter, the mark x represents that the step up ratio γ lowers by the increase of the value of the relevant parameter, and the mark – represents that the change of the value of the relevant parameter does not affect the step up ratio γ.

TABLE 1

| | $Q_{02}$ | $k_{31}$ | $k_{33}$ | $\epsilon_{33}^T$ | $l_w$ | $l_g$ | $l_t$ | $Q_m$ | S |
|---|---|---|---|---|---|---|---|---|---|
| (a) | ○ | ○ | — | — | ○ | X | ○ | X |
| (b) | ○ | X | ○ | ○ | X | — | — | ○ |
| (c) | ○ | X | — | — | ○ | X | — | — |
| (d) | ○ | ○ | ○ | ○ | X | — | ○ | — |

Further, when the output consumed at the effective resistance $R_{02}$ in FIG. 4 is expressed by $P_{out}$ and the electric power loss is expressed by $P_{LOSS}$ in the piezoelectric transformer 20, the efficiency η of the piezoelectric transformer 20 is expressed by the following expression (7).

$$\eta = P_{out}/(P_{out}+P_{LOSS}) = AQmQ_{02}/\{1+AQmQ_{02}+Q^2_{02}(1+S)^2\} \quad (7)$$

As it is obvious from the above expressions (1) to (7) and Table 1, in arbitrary applications ranging from high load to low load, it is possible to reduce the electric power loss and raise the efficiency η by increasing Qm. Further, the increase of Qm acts toward the increase of the step up ratio as a whole. Furthermore, it is possible to increase the step up ratio in all applications by increasing the electromechanical coupling factor $k_{31}$. In addition, in light load applications like the region (a) and heavy load applications like the region (c), it is possible to increase the step up ratio by reducing the thickness $l_t$ of the dielectric layer 21.

Here, by composing a dielectric layer 21 with a polycrystalline material of lithium niobate or the like having a high Qm by using the production method according to the present embodiment, it is possible to form a dielectric layer of a thin thickness that has never been realized with a monocrystal of the lithium niobate or the like, at a high yield through very simple processes. As a consequence, by the present embodiment, it becomes possible to form a piezoelectric transformer of a higher efficiency and a higher step up ratio. Further, it also becomes possible to produce such a multilayered piezoelectric transformer 10 as shown in FIGS. 1 and 2 at a high yield and a low cost through simple processes. Furthermore, on the occasion of producing the multilayered piezoelectric transformer 10, it becomes possible to use a material for a dielectric layer that has not heretofore been used (for example, lithium niobate or the like).

As explained above, by the dielectric layer, the dielectric element, and the production methods thereof according to the embodiments of the present invention, it becomes possible to increase the degree of freedom in the design of the dielectric element and readily cope with the trend of higher performance such as multi-layering.

Suggestion for Modifications

Note that the present invention is not limited to the aforementioned embodiments and may arbitrarily be modified in the range where the essential part of the present invention is not changed. That is, the present invention is not at all limited to the aforementioned concrete examples of the configurations and the production methods. Modifications are exemplified hereunder, but the present invention is not limited also to the following modifications, either.

The present invention may be applied to, in addition to the piezoelectric transformer stated in the above embodiments, for example an electron emitter of a piezoelectric/electrostrictive type, a surface acoustic wave (SAW) element, and the like.

Further, though an input electrode 12 and a ground electrode 13 are not formed on the top and bottom surfaces of the dielectric layer 11 in the configuration of the piezoelectric transformer 10 according to the first embodiment shown in FIGS. 1 and 2, those electrodes may be formed on the surfaces.

Furthermore, the classifying process may be omitted in the production methods of the aforementioned embodiments.

Any proportion of the weight of the oriented raw material particles to the total powder weight at the forming is acceptable as long as it is in the range roughly from 5% to 70%. Further, it is also acceptable: to apply, prior to the slurry forming process, an interim firing process of producing dielectric material powder by heat-treating the raw material powder of the dielectric material and thus subjecting the raw material powder to solid phase reaction; and thereby to produce the oriented raw material particles. In this case, in the slurry forming process, it is also acceptable to produce slurry by mixing only a binder with the oriented raw material particles. Further, raw material powder of a dielectric material before processed in the interim firing process may be mixed with the oriented raw material particles and the binder. Furthermore, powder of a dielectric material may be mixed with the oriented raw material particles and the binder.

What is claimed is:

1. A method of producing a dielectric layer comprising a polycrystalline dielectric material having anisotropy in the coefficient of thermal expansion, the method comprising the steps of:
   providing a raw material powder of raw material particles having a chemical composition defined by a chemical formula;
   heat treating the raw material powder at least to a temperature sufficient to cause a phase change from a first crystal orientation at room temperature to a different crystal orientation to provide an aggregate of oriented raw material particles having a chemical composition defined by the same chemical formula as that of the raw material powder but having the different crystal orientation, wherein a crystal lattice of the oriented raw material particles is oriented in a prescribed direction and the oriented raw material particles have a shape wherein a longitudinal direction of the shape forms a prescribed angle with respect to the prescribed direction;
   forming a compact from the aggregate of oriented raw material particles, including a step of applying a shearing force to the aggregate; and
   firing the compact to form the dielectric layer.

2. The method according to claim 1, wherein the composition of the raw material powder comprises at least one of $Nb_2O_5$ and $Ta_2O_5$;

wherein during the heat treating step, the crystal lattice of the raw material particles is oriented in the c-axis direction, so that the longitudinal direction of the shape of the oriented raw material particles is identical to the c-axis direction;

wherein the compact forming step includes mixing the oriented raw material particles with a carbonate or an oxide of at least one element selected from the group consisting of K, Na and Li; and wherein during the firing step, the oriented raw material particles and the carbonate or oxide undergo a solid phase reaction to produce a dielectric material comprising a substance expressed by a general expression $ABO_3$, wherein A is at least one of K, Na and Li and B is at least one of Nb and Ta, and the polycrystalline dielectric material is formed by growing the crystal grains of the dielectric material.

3. The method of producing a dielectric layer according to claim 2, wherein the method includes a classifying step of applying a classifying treatment to the raw material powder before the heat treating step.

4. The method of producing a dielectric layer according to claim 3, wherein the compact forming step includes:

a step of forming a slurry by mixing a binder with a powder comprising the oriented raw material particles; and a step of applying a shearing force to the slurry to produce the compact.

5. A method of producing a dielectric element comprising at least one dielectric layer comprising a polycrystalline dielectric material having anisotropy in the coefficient of thermal expansion, and at least one electrode, which extends in a direction that is parallel with a surface of the dielectric layer, formed on the surface of the at least one dielectric layer, the method comprising the steps of:

providing a raw material powder of raw material particles having a chemical composition defined by a chemical formula;

heat treating the raw material powder at least to a temperature sufficient to cause a phase change from a first crystal orientation at room temperature to a different crystal orientation to provide an aggregate of oriented raw material particles having a chemical composition defined by the same chemical formula as that of the raw material powder but having the different crystal orientation, wherein a crystal lattice of the oriented raw material particles is oriented in a prescribed direction and the oriented raw material particles have a shape wherein a longitudinal direction of the shape forms a prescribed angle with respect to the prescribed direction;

forming a laminar compact from the aggregate of oriented raw material particles, including a step of applying a shearing force to the aggregate; and firing the laminar compact to form the at least one dielectric layer.

6. The method according to claim 5, wherein the composition of the raw material powder comprises at least one of $Nb_2O_5$ and $Ta_2O_5$;

wherein during the heat treating step, the crystal lattice of the raw material particles is oriented in the c-axis direction, so that the longitudinal direction of the shape of the oriented raw material particles is identical to the c-axis direction;

wherein the compact forming step includes mixing the oriented raw material particles with a carbonate or an oxide of at least one element selected from the group consisting of K, Na and Li; and wherein during the firing step, the oriented raw material particles and the carbonate or oxide undergo a solid phase reaction to produce a dielectric material comprising a substance expressed by a general expression $ABO_3$, wherein A is at least one of K, Na and Li and B is at least one of Nb and Ta, and the polycrystalline dielectric material is formed by growing the crystal grains of the dielectric material.

7. The method of producing a dielectric element according to claim 6, wherein the method includes a classifying step of applying a classifying treatment to the raw material powder before the heat treating step.

8. The method of producing a dielectric element according to claim 7, wherein the compact forming step includes:

a step of forming a slurry by mixing a binder with a powder comprising the oriented raw material particles; and a step of applying a shearing force to the slurry to produce the compact.

9. The method of producing a dielectric element according to claim 8, wherein the method further includes the steps of:

forming one or more films containing an electric conductive material or a precursor thereof on at least one of a top and a bottom surface of the compact; and laminating a plurality of the compacts, after the film forming step, to form a plurality of layered compacts, wherein the longitudinal directions of the oriented raw material particles are aligned in the same direction in the plurality of layered compacts;

wherein the firing step fires and integrates the plurality of layered compacts laminated and the interposing films.

* * * * *